United States Patent [19]

Kobayashi et al.

[11] Patent Number: 5,111,427
[45] Date of Patent: May 5, 1992

[54] NONVOLATILE CONTENT-ADDRESSABLE MEMORY AND OPERATING METHOD THEREFOR

[75] Inventors: Kazuo Kobayashi; Yasushi Terada; Takeshi Nakayama, all of Hyogo, Japan

[73] Assignee: Mitsubishi Denki Kabushiki Kaisha, Tokyo, Japan

[21] Appl. No.: 310,115

[22] Filed: Feb. 14, 1989

[30] Foreign Application Priority Data

Jun. 1, 1988 [JP] Japan ............................. 63-136136

[51] Int. Cl.$^5$ ..................... G11C 15/00; G11C 11/00
[52] U.S. Cl. .................................. 365/49; 365/228; 365/154; 365/185
[58] Field of Search ............... 365/49, 154, 185, 228, 365/227

[56] References Cited

U.S. PATENT DOCUMENTS

| | | | |
|---|---|---|---|
| 3,633,182 | 1/1972 | Koo | 365/49 |
| 4,224,686 | 9/1984 | Aneshansley | 365/154 |
| 4,333,166 | 6/1982 | Edwards | 365/182 X |
| 4,375,086 | 2/1983 | van Velthoven | 365/228 |
| 4,375,677 | 3/1983 | Schuermeyer | 365/154 |
| 4,532,609 | 7/1985 | Iizuka | 365/154 |
| 4,803,662 | 2/1989 | Tanaka | 365/185 |

FOREIGN PATENT DOCUMENTS 5918794 10/1975 Japan .

OTHER PUBLICATIONS

H. Kodata et al., "An 8Kb Content-Addressable and Reentrant Memory" 1985 IEEE International Solid-State Circuits Conference, Digest of Technical Paper (Feb. 13, 1985).
N. Becker et al., "A 5V-Only 4K Nonvolatile Static RAM", 1983 IEEE International Solid-State Circuits Conference, Digest of Technical Papers (Feb. 24, 1983).

Primary Examiner—Stuart N. Hecker
Assistant Examiner—Michael A. Whitfield
Attorney, Agent, or Firm—Lowe, Price, LeBlanc, Becker & Shur

[57] ABSTRACT

Each of memory cells in a nonvolatile content-addressable memory (CAM) comprises a first memory transistor connected to a first storage node, a second memory transistor connected to a second storage node, and a memory capacitor connected between said first and second storage nodes. The first storage node is connected to a first bit line through an MOS transistor, and the second storage node is connected to a second bit line through the MOS transistor. In addition, each of the memory cells has a function of determining whether or not information applied to the first and second bit lines and information applied to the first and second storage nodes match with each other. In the nonvolatile CAM, writing and reading by a DRAM operation become possible by using the memory capacitor in each of the memory cells. In addition, in the nonvolatile CAM, nonvolatile writing and reading by an EEPROM operation become possible by using the first and second memory transistors in each of the memory cells. Furthermore, information stored in the memory capacitor or the first and second memory transistors in each of the memory cells can be searched by applying search information to the corresponding first and second bit line pairs.

15 Claims, 11 Drawing Sheets

FIG.8

| OPERATION | MODE | BL | $\overline{BL}$ | WL | SL | M |
|---|---|---|---|---|---|---|
| DRAM | WRITING | H/L (INPUT DATA) | L/H (INPUT DATA) | H | L | FLOATING |
| | READING | FLOATING | FLOATING | H | L | FLOATING |
| | SEARCH | H/L (SEARCH DATA) | L/H (SEARCH DATA) | L | L | FLOATING ("H" PRECHARGING) |
| EEPROM | WRITING | Vpp/L | L/Vpp | Vpp | L | FLOATING |
| | READING | FLOATING | FLOATING | H | H | FLOATING |
| | SEARCH | H/L (SEARCH DATA) | L/H (SEARCH DATA) | L | H | FLOATING ("H" PRECHARGING) |

005,111,427

NONVOLATILE CONTENT-ADDRESSABLE MEMORY AND OPERATING METHOD THEREFOR

BACKGROUND OF THE INVENTION

1. Field of The Invention

The present invention relates generally to a nonvolatile CAM (Content-Addressable Memory), and more particularly, to a nonvolatile CAM capable of searching an address having information stored therein when the content of the information is specified, in addition to an ordinary memory function of specifying an address to read and write data.

2. Background Art

In recent computers, a part of data stored in a large capacity main memory is stored in a small capacity cache memory accessible at high speed, so that the access time is shortened.

FIG. 1 is a diagram showing a schematic structure of a cache memory system. In FIG. 1, data frequently accessed out of data stored in a main memory 51 is also stored in a cache memory 52. In such a cache memory system, it is necessary to determine which address in the main memory 51 corresponds to data to be stored in the cache memory 52. Thus, a CAM 53 is provided which can search information when the information is specified. An address in the main memory 51 corresponding to the data stored in the cache memory 52 is stored in the CAM 53. In the cache memory system shown in FIG. 1, if and when a CPU (Central Processing Unit 54) makes access to an address in the main memory 51, the address is first applied to the CAM 53. When the address is stored in the CAM 53, a cache hit signal CH is applied to a main controller 55. When the main controller 55 receives the cache hit signal CH, the CPU 54 makes access to the cache memory 52. On the other hand, when the address is not stored in the CAM 53, the CPU 54 makes access to the main memory 51.

FIG. 2 is an electric circuit diagram showing a memory cell in a conventional volatile CAM shown in ISSCC (Digest of Technical Paters, pp. 42 to 43, 1985).

In FIG. 2, the CAM comprises a CMOS (Complementary Metal Oxide Semiconductor) static RAM (Random Access Memory) portion A and a matching portion B. The matching portion B comprises four MOS transistors T7 to T10. The MOS transistors T7 and T8 are connected in series, and the MOS transistors T9 and T10 are connected in series. The MOS transistor T7 has its source connected to ground and its gate connected to a second storage node N2 in the CMOS static RAM portion A of a flip-flop. The MOS transistor T8 has its gate connected to a bit line BL constituting a bit line pair and its drain connected to a match line M.

The MOS transistor T9 has its source connected to ground and its gate connected to a first storage node N1 in the CMOS static RAM portion A. The MOS transistor T10 has its gate connected to a bit line $\overline{BL}$ and its drain connected to the match line M.

The CMOS static RAM portion A comprises four MOS transistors T3 to T6 as well as two MOS transistors T1 and T2 each serving as selecting transistor. The MOS transistor T1 has its source connected to the first storage node N1 in the CMOS static RAM portion A, its drain connected to the bit line BL and its gate connected to a word line WL. In addition, the MOS transistor T2 has its source connected to the second storage node N2 in the CMOS static RAM portion A, its drain connected to the bit line $\overline{BL}$ and its gate connected to the word line WL.

Description is now made on an operation of the conventional CAM shown in FIG. 2. First, at the time of searching, a potential on the word line WL is set to an "L" level, and the match line M is precharged to an "H" level. In addition, search data is applied to the bit line BL, and an inverted signal of the search data is applied to the bit line $\overline{BL}$. For example, when it is desired to search "1", a potential on the bit line BL is set to the "H" level while a potential on the bit line $\overline{BL}$ is set to the "L" level. If "1" is stored in the CMOS static RAM portion A, that is, if a potential of the first storage node N1 is at the "H" level and a potential of the second storage node N2 is at the "L" level, the MOS transistors T9 and T8 are rendered conductive while the MOS transistors T7 and T10 are rendered non-conductive, so that a potential on the match line M remains at the "H" level. If "0" is stored in the CMOS static RAM portion A, that is, if the potential of the first storage node N1 is at the "L" level and potential of the second storage node N2 is at the "H" level, the MOS transistors T7 and T8 are rendered conductive, so that the match line M is discharged such that a potential thereon becomes a ground potential, which means mismatch.

The memory cell in the conventional CAM comprises the CMOS static RAM portion A of a flip-flop and the matching. portion B, as described above. Thus, if the power supply is turned off, data stored in the CMOS static RAM portion A is lost.

SUMMARY OF THE INVENTION

An object of the present invention is to provide a CAM in which stored data is not lost even if a power supply is turned off.

Another object of the present invention is to provide a CAM capable of performing high-speed writing and reading operations and storing information in a nonvolatile manner.

Still another object of the invention is to provide a CAM capable of performing a nonvolatile memory operation, a dynamic random access memory operation and a search operation.

Still another object of the present invention is to provide a method for operating a nonvolatile CAM capable of performing high-speed writing and reading operations, a nonvolatile memory operation and a search operation.

A further object of the present invention is to provide a nonvolatile CAM capable of performing a DRAM (Dynamic Random Access Memory) operation, an EEPROM (Electrically Erasable and Programmable Read Only Memory) operation and a search operation.

The nonvolatile CAM according to the present invention comprises at least one word line, at least one bit line pair comprising first and second bit lines and intersecting with the word line, a match line corresponding to the word line, and a memory cell provided at an intersection of the word line and the bit line pair and having first and second storage nodes receiving complementary information. The memory cell comprises capacitance means coupled between the first storage node and the second storage node, first nonvolatile memory means coupled to the first storage node and capable of writing and erasing information, second nonvolatile memory means coupled to the second storage node and capable of writing and erasing information first switching means responsive to a potential applied to the word line for electrically connecting or disconnecting the first bit line and the first storage node, second switching means responsive to a potential applied to the word line for electrically connecting or disconnecting the second bit line and the second storage node and matching sense means for applying a matching signal to the match line when information applied to the first and second bit lines match with information applied to the first and second storage nodes.

Since the memory cell in the nonvolatile CAM according to the present invention comprises capacitance means and first and second nonvolatile memory means, information is dynamically stored in the capacitance means and information is stored in the nonvolatile memory means in a nonvolatile manner. Thus, in this nonvolatile CAM, high-speed writing and reading and detection of match performed by the dynamic memory operation become possible and nonvolatile writing and reading and detection of match performed by the nonvolatile memory operation become possible.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a diagram showing the condition of a voltage applied to each signal line in each operation mode;

DESCRIPTION OF THE PREFERRED EMBODIMENTS

Figure 1:
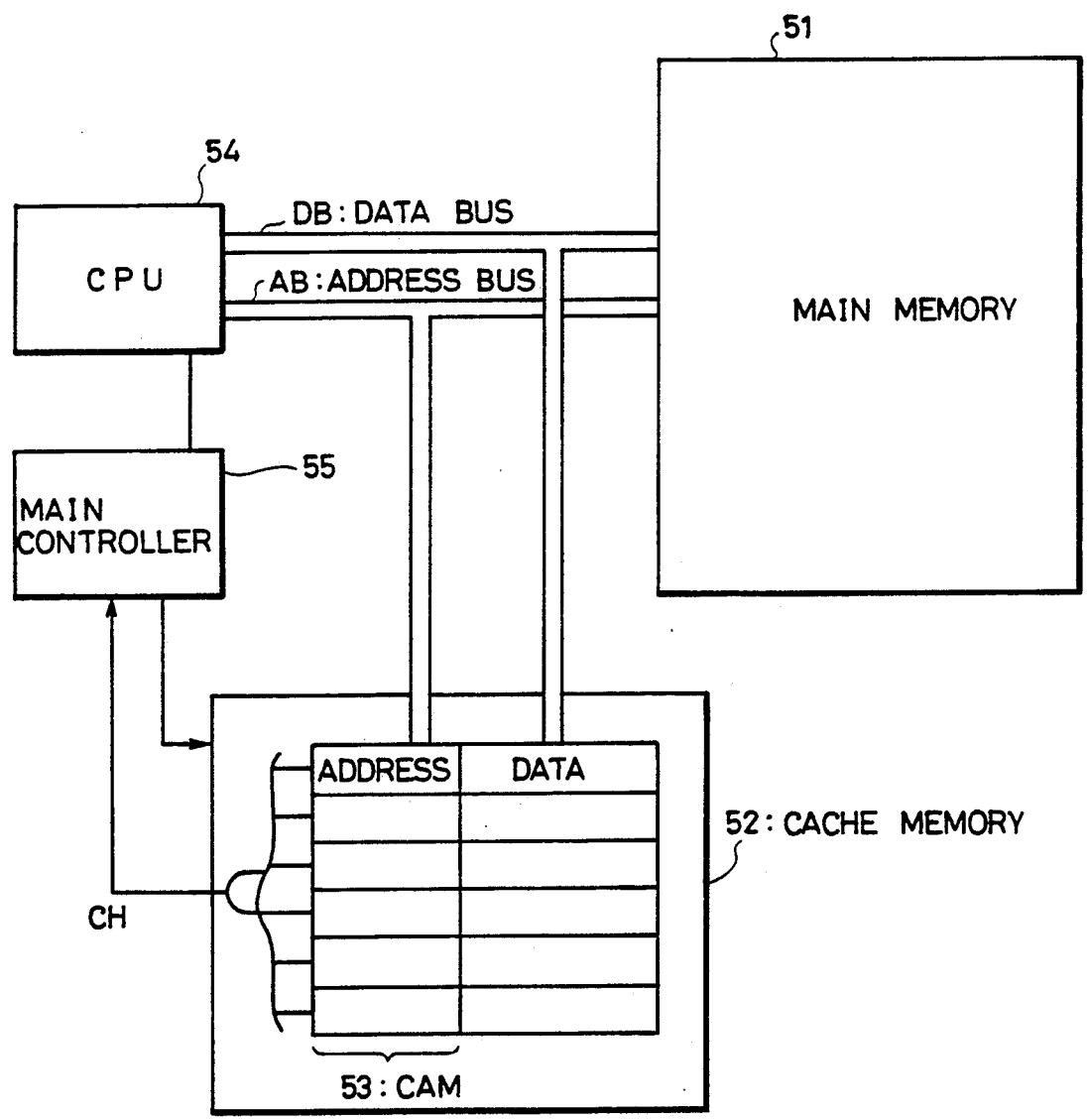
FIG. 1 is a diagram showing a cache memory system using a CAM.
Figure 2:
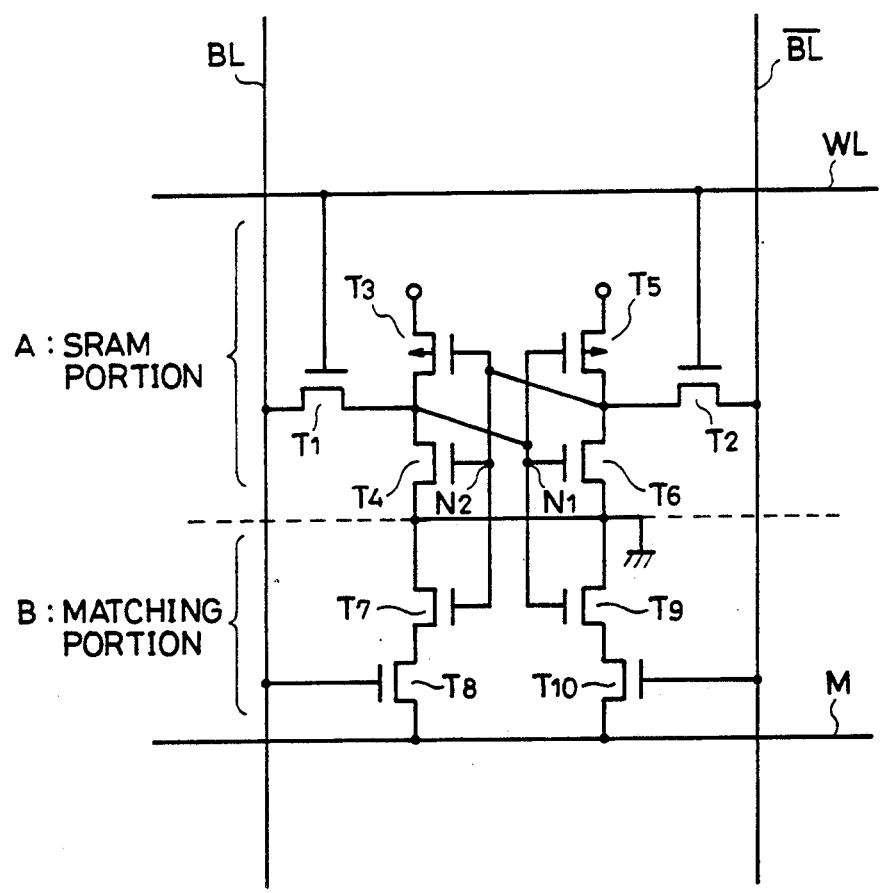
FIG. 2 is a circuit diagram of a memory cell in a conventional volatile CAM.

Referring now to the drawings, embodiments of the present invention will be described in detail.

Figure 3:
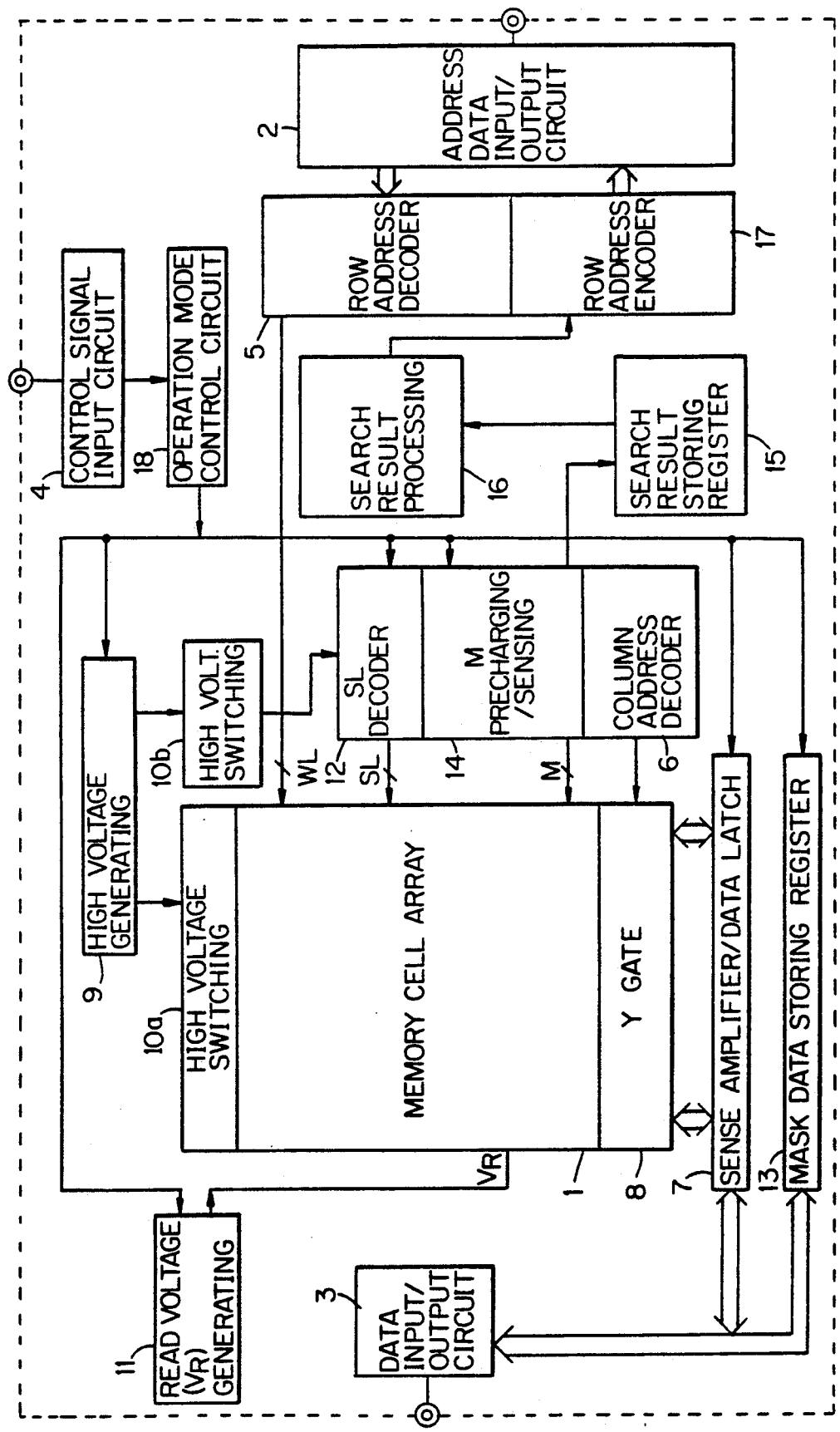
FIG. 3 is a block diagram showing the entire structure of a nonvolatile CAM according to one embodiment of the present invention.
Figure 4:
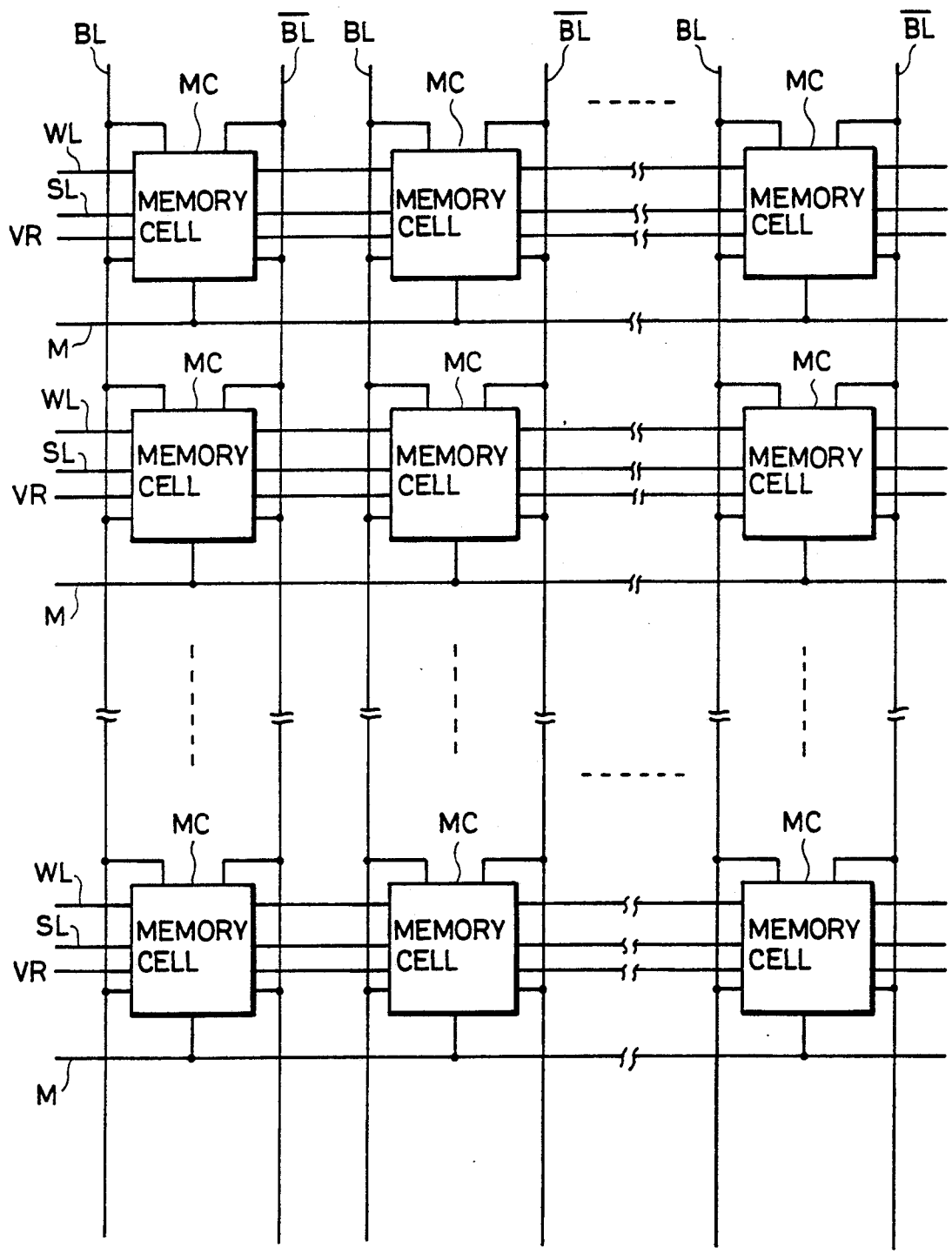
FIG. 4 is a circuit diagram showing a structure of memory cell array shown in FIG. 3.
Figure 5:
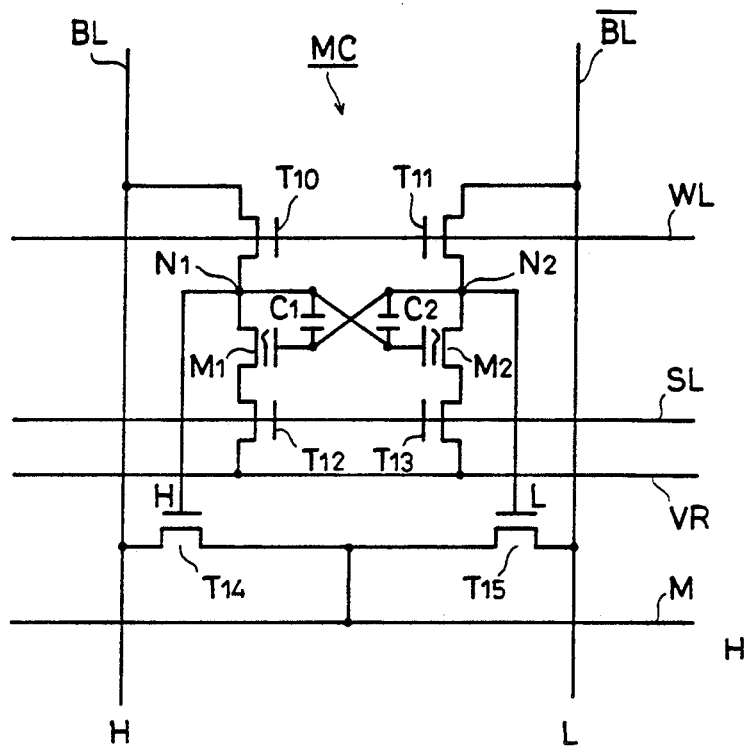
FIG. 5 is a diagram showing a circuit structure of a memory cell shown in FIG. 4.

FIG. 3 is block diagram showing the entire structure of a nonvolatile CAM according to one embodiment of the present invention, FIG. 4 is a diagram showing a structure of a memory cell array included in the nonvolatile CAM shown in FIG. 3, and FIG. 5 is a circuit diagram of a memory included in the memory cell array shown in FIG. 4.

Referring now to FIG. 5, description is made on a structure of a memory cell included in a nonvolatile CAM according to the present embodiment.

In FIG. 5, a memory cell MC comprises N channel MOS transistors T10 to T15 and memory transistors M1 and M2. The transistor T10 is connected between a bit line BL and a storage node N1, and the transistor T11 is connected between a bit line $\overline{BL}$ and a storage node N2. The transistors T10 and T11 have their gates connected to a word line WL. Each of the transistors T10 and T11 serves as a selecting transistor. In addition, the memory transistor M1 and the transistor T12 are connected in series between the storage node N1 and a read potential line VR. The memory transistor M2 and the transistor T13 are connected in series between the storage node N2 and the read potential line VR. The memory transistor M1 has its gate connected to the storage node N2, and the memory transistor M2 has its gate connected to the storage node N1. The transistors T12 and T13 have their gates connected to a signal line SL. A read voltage VR is applied to the read potential line VR. This read potential $V_R$ is generally a power-supply potential $V_{CC}$. In addition, the transistor T14 is connected between the bit line BL and a match line M. The transistor T14 has its gate connected to the storage node N1. The transistor T15 is connected between the bit line $\overline{BL}$ and the match line M. The transistor T15 has its gate connected to the storage node N2. Stray capacitances C1 and C2 exist between the storage nodes N1 and N2.

Figure 6:
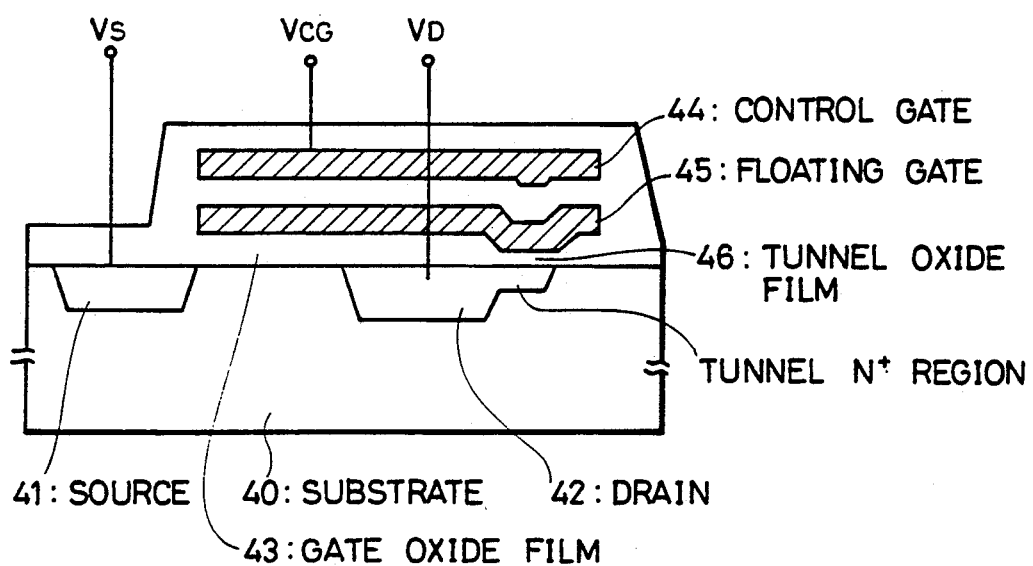
FIG. 6 is a cross-sectional view showing one example of a structure of a memory transistor.

FIG. 6 is a schematic cross-sectional view of each of the memory transistors M1 and M2.

In FIG. 6, a source 41 and a drain 42 are formed in a substrate 40, and a gate electrode having a two-layer structure comprising a control gate 44 and a floating gate 45 is formed thereon through a gate oxide film 43. The control gate 44 serves as a gate of an ordinary transistor. In addition, the floating gate 45 is formed between a channel and the control gate 44, which is insulated from other terminal. Thus, the threshold voltage of the memory transistor varies depending on the amount of electrons stored in the floating gate 45. More specifically, the threshold voltage is increased when electrons are injected into the floating gate 45 while being decreased when electrons are emitted from the floating gate 45.

A thin tunnel oxide film 46 having a thickness of approximately 100A is formed between the drain 42 and the floating gate 45 in the memory transistor. The above described injection and emission of electrons to and from the floating gate 45 is performed by applying an electric field of approximately 10 MV/cm therebetween to tunnel electrons. The potential difference between the drain 42 and the floating gate 45 is mainly divided in the ratio of a capacitance between the control gate 44 and the floating gate 45 to a capacitance of the tunnel oxide film 46 between the floating gate 45 and the drain 42. Thus, in order to achieve the above described electric field of 10 MV/cm, a high voltage $V_{pp}$ of approximately 15 to 20 V must be applied to the control gate 44 or the drain 42 during a period of several ms.

Description is now made on an operation of the memory cell MC shown in FIG. 5.

The memory cell MC, which can perform a DRAM (Dynamic Random Access Memory) operation and an EEPROM (Electrically Erasable and Programmable Read Only Memory) operation, has a write mode, a read mode and a search mode in each of the operations. FIG. 8 is a diagram showing the condition of a voltage applied to each signal line in each of the operation modes. Referring now to FIG. 8, description is made one each of the operation modes.

(1) Write mode of DRAM operation

Figure 7:
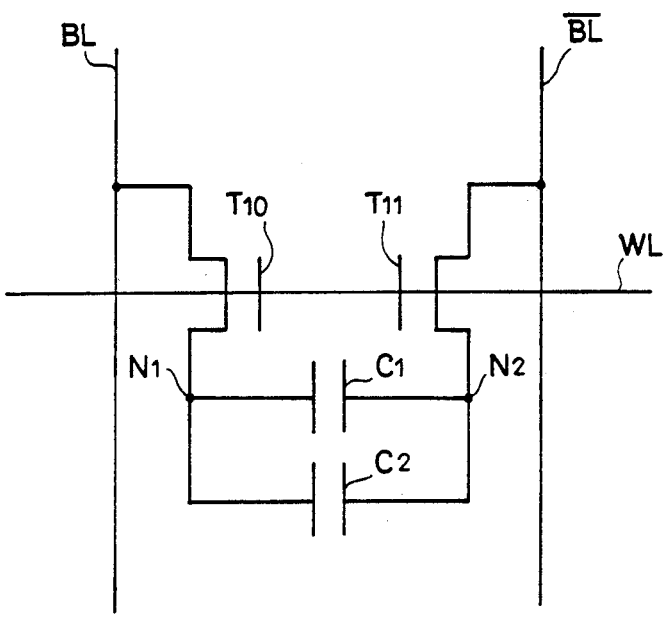
FIG. 7 is a diagram showing an equivalent circuit in a DRAM operation of the memory cell shown in FIG. 5.
Figure 11:
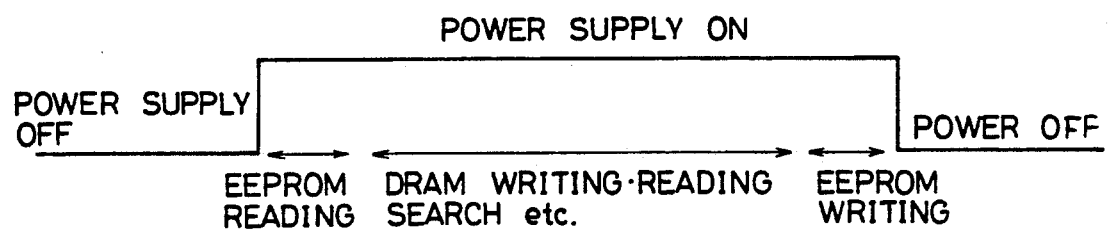
FIG. 11 is a diagram showing one example of a method for employing the nonvolatile CAM shown in FIG. 3.

At the time of writing, a potential on the signal line SL is brought to an "L" level, and the match line M is rendered electrically floating. Consequently, the transistors T12 and T13 are turned off, so that sources of the memory transistors M1 and M2 are rendered electrically floating. As a result, the stray capacitances C1 and C2 between the respective control gates and the respective drains of the memory transistors M1 and M2 serves as capacitors, respectively. FIG. 7 is a diagram showing an equivalent circuit of the memory cell MC at the time of the DRAM operation. For example, when data "1" is written, a potential on the bit line BL is brought to an "H" level while a potential on the bit line $\overline{BL}$ is brought to the "L" level. When a potential on the work line WL is raised, the transistors T10 and T11 are turned on, so that both electrodes of the capacitances C1 and C2 are charged or discharged through the bit lines BL and $\overline{BL}$, respectively.

(2) Read mode of DRAM operation

At the time of reading, the potential on the signal line SL is brought to the "L" level and the match line M is rendered electrically floating, as at the time of writing. The potentials on the bit lines BL and $\overline{BL}$ are brought to an equal potential ($V_E$) level and then, the potential on the work line WL is raised to the "H" level. For example, when data "1" is stored, charges stored in the storage nodes N1 and N2 are Q (N1)=$V_W C_0$, Q (N2)=0, respectively, where $V_W$ denotes a potential of the storage node N1 at the time of writing, and $C_0$ denotes the sum of a capacitance value $C_1$ of the stray capacitance C1 and a capacitance value $C_2$ of the stray capacitance C2. Thus, potentials $V_{BL}$ and $V_{\overline{BL}}$ on the bit lines BL and $\overline{BL}$ to occur when the work line WL attains the "H" level are represented by the following equations, respectively, according to the law of conservation of charge;

$$V_{BL} = \frac{V_E C_{BL} + V_W C_0}{C_{BL} + C_0} \quad (1)$$

$$V_{\overline{BL}} = \frac{V_E C_{BL} - V_W C_0}{C_{BL} + C_0} \quad (2)$$

where $C_{BL}$ denotes a bit line capacitance. From the equations (1) and (2), a potential difference V between the bit lines BL and $\overline{BL}$ is represented by the following equation:

$$\Delta V = V_{BL} - V_{\overline{BL}} \quad (3)$$
$$= \frac{2 V_W C_0}{C_{BL} + C_0}$$

Thus, when the potential difference V is amplified by a sense amplifier, read data is obtained. Only the capacitance values of the capacitances C1 and C2 are considered. However, if the stray capacitances between the storage nodes N1 and N2 and the substrate are considered, the potential difference V in the equation (3) is further increased.

(3) Search mode of DRAM operation

At the time of retrieving coincidence, the potential on the signal line SL is brought to the "L" level, and the potential on the word line WL is brought to the "L" level. In addition, search data is applied to the bit line pair BL and $\overline{BL}$. For example, when the search data is "1", the potential on the bit line BL is brought to the "H" level while the potential on the bit line $\overline{BL}$ is brought to the "L" level. The match line M is precharged to the "H" level and then, rendered electrically floating. When data "1" is stored in a memory capacitor, the potential of the storage node N1 is at the "H" level while the potential of the storage node N2 is at the "L" level. Thus, the respective potential differences between the gates and the sources of the transistors T14 and T15 are 0V and −5V, so that the transistors are turned off. Therefore, charges in the match line M is not discharged, so that the potential on the match line M remains at the "H" level (detection of match). On the other hand, if data "0" is stored in the memory capacitor, the potential of the node N1 is at the "L" level while the potential of the node N2 is at the "H" level. Thus, the transistor T14 is turned off while the transistor T15 is turned on. Therefore, charges in the match line M is discharged through the transistor T15, so that the potential on the coincidence detecting line M attains the "L" level (detection of mismatch).

(4) Write mode of EEPROM operation

At the time of writing, the potential on the signal line SL is brought to the "L" level, and the match line M is rendered electrically floating. Consequently, the respective sources of the memory transistors M1 and M2 are rendered electrically floating. For example, if data "1" is written, a high voltage $V_{PP}$ is applied to the bit line BL while 0V is applied to the bit line $\overline{BL}$. In addition, the high voltage $V_{PP}$ is applied to the word line WL. Thus, the high voltage $V_{PP}$ is applied to the drain of the memory transistor M1, and 0V is applied to the control gate thereof. Furthermore, the high voltage $V_{PP}$ is applied to the control gate of the memory transistor M2, and 0V is applied to the drain thereof. Therefore, electrons are emitted from the floating gate of the memory transistor M1, while electrons are injected into the floating gate of the memory transistor M2. As a result, a threshold voltage $V_{TH}$ of the memory transistor M1 is shifted in a negative direction, while a threshold voltage $V_{TH}$ of the memory transistor M2 is shifted in a positive direction. In the above described manner, writing is terminated.

(5) Read mode of EEPROM operation

At the time of reading, the respective potentials on the signal line SL and the word line WL are brought to the "H" level, and the match line M is rendered electrically floating. Consequently, the transistors T12 and T13 are turned on. For example, when data "1" is stored, the threshold voltage $V_{TH}$ of the memory transistor M1 is negative while the threshold voltage $V_{TH}$ of the memory transistor M2 is positive. Thus, if the sources of the memory transistors M1 and M2 are charged by the read potential line VR through the transistors T12 and T13, respectively, the memory transistor M1 is turned on while the memory transistor M2 is turned off. Consequently, the bit line BL is charged through the transistor T12, the memory transistor M1 and the transistor T10. On the other hand, the potential on the bit line $\overline{BL}$ is not changed. Thus, when the potential difference between the bit lines BL and $\overline{BL}$ is amplified by the sense amplifier, the potential on the bit line BL attains the "H" level.

(6) Search mode of EEPROM operation

At the time of searching match, the potential on the word line WL is brought to the "L" level, and the match line M is rendered electrically floating. Thereafter, search data is applied to the bit lines BL and $\overline{BL}$. In addition, the potential on the signal line SL is brought to the "H" level, and the match line M is rendered electrically floating after it is precharged at the "H" level. Assuming that data "1" is stored, the threshold voltage $V_{TH}$ of the memory transistor M1 is negative while the threshold voltage $V_{TH}$ of the memory transistor M2 is positive. For example, if the search data is "1", the potential on the bit line BL is brought to the "H" level while the potential on the bit line $\overline{BL}$ is brought to the "L" level. Thus, the gate of the transistor T14 is charged by the read potential line VR through the transistor T12 and the memory transistor M1. On the other hand, the gate of the transistor T15 remains discharged. Therefore, the transistors T14 and T15 are both turned off, so that the potential on the match line M remains at the "H" level (detection of match). Contrary to this, if the search data is "0", the potential on the bit line BL is brought to the "L" level while the potential on the bit line $\overline{BL}$ is brought to the "H" level, so that the transistor T14 is turned on. Therefore, charges in the match line M are discharged through the transistor T14, so that the potential on the match line M attains the "L" level (detection of mismatch).

Description is now made on a structure of a nonvolatile CAM shown in FIG. 3 using the memory cell MC shown in FIG. 5.

In a memory cell array 1 shown in FIG. 3, memory cells shown in FIG. 5 are arranged in a plurality of rows and columns, as shown in FIG. 4. The plurality of memory cells MC in each column are connected to a common bit line pair BL and $\overline{BL}$. In addition, a plurality of memory cells on each row are connected to a common word line WL, a common signal line SL, a common match line M and a common read potential line VR.

In FIG. 3, an address data input/output circuit 2, a data input/output circuit 3 and a control signal input circuit 4 are used as an interface portion to the exterior. The address data input/output circuit 2 inputs an address signal in a normal mode (write/read mode) in a DRAM operation and an EEPROM operation while inputting an address signal for addressing mask data and outputting a match address in a search mode. The data input/output circuit 3 inputs write data and outputs read data in the normal mode while inputting search data in the search mode. The control signal input circuit 4 inputs a control signal for designating each operation mode.

Additionally, a row address decoder 5, a column address decoder 6, a sense amplifier/data latch 7 and a Y gate 8 are used in common in the DRAM operation and the EEPROM operation. The row address decoder 5 is responsive to the address signal applied from the address data input/output circuit 2 for selecting the word line WL in the memory cell array 1. The column address decoder 6 is responsive to the address signal applied from the address data input/output circuit 2 for selecting a transfer gate in the Y gate 8. The sense amplifier/data latch 7 amplifies the potential difference between the bit line pair BL and $\overline{BL}$ and latches write data and read data. The Y gate 8 is a connecting portion of the bit line pair BL and $\overline{BL}$ with the sense amplifier/data latch 7 in the memory cell array 1. The transfer gate selected by the column address decoder 6 is opened, so that a corresponding bit line pair BL and $\overline{BL}$ is connected to the sense amplifier/data latch 7.

A high voltage generating circuit 9, high voltage switching circuits 10a and 10b, a read voltage generating circuit 11 and an SL decoder 12 are used in only the EEPROM operation. The high voltage generating circuit 9 generates a high voltage $V_{PP}$ (about 20V) in a certain time period when it writes data into the memory cell MC in a nonvolatile manner. The high voltage switching circuit 10a raises a potential on a bit line of the "H" level out of the selected bit line pair BL and $\overline{BL}$ to the high voltage $V_{PP}$ while maintaining a potential on a bit line of the "L" level at a ground potential. The high voltage switching circuit 10b raises a potential on the selected word line WL to the high voltage $V_{PP}$ while maintaining a potential on a non-selected word line WL at the ground potential. The read voltage generating circuit 11 applies a read voltage $V_R$ to a read potential line VR of the memory cell array 1. The SL decoder 12 selects only the signal line SL corresponding to the selected word line WL at the time of reading, to raised a potential thereon to the "H" level.

Furthermore, a mask data storing register 13, an M precharging/sensing circuit 14, a search result storing register 15, a search result processing circuit 16 and a row address encoder 17 constitute a search processing system. The mask data storing register 13 does not apply search data to both bit lines in the bit line pair BL and $\overline{BL}$ to be masked but applies the potential of the "H" level, in a masking operation as described below. The M precharging/sensing circuit 14 precharges the match line M at the "H" level and outputs match/mismatch in the search mode. The search result storing register 15 stores the result of search for each row of the memory cell array 1. The search result processing circuit 16 collectively processes the result of search of the plurality of rows. The row address encoder 17 converts an output of the search result processing circuit 16 into an address signal.

An operation mode control circuit 18 designates a normal mode or a search mode, a write mode or a read mode and a masking operation.

Figure 9:
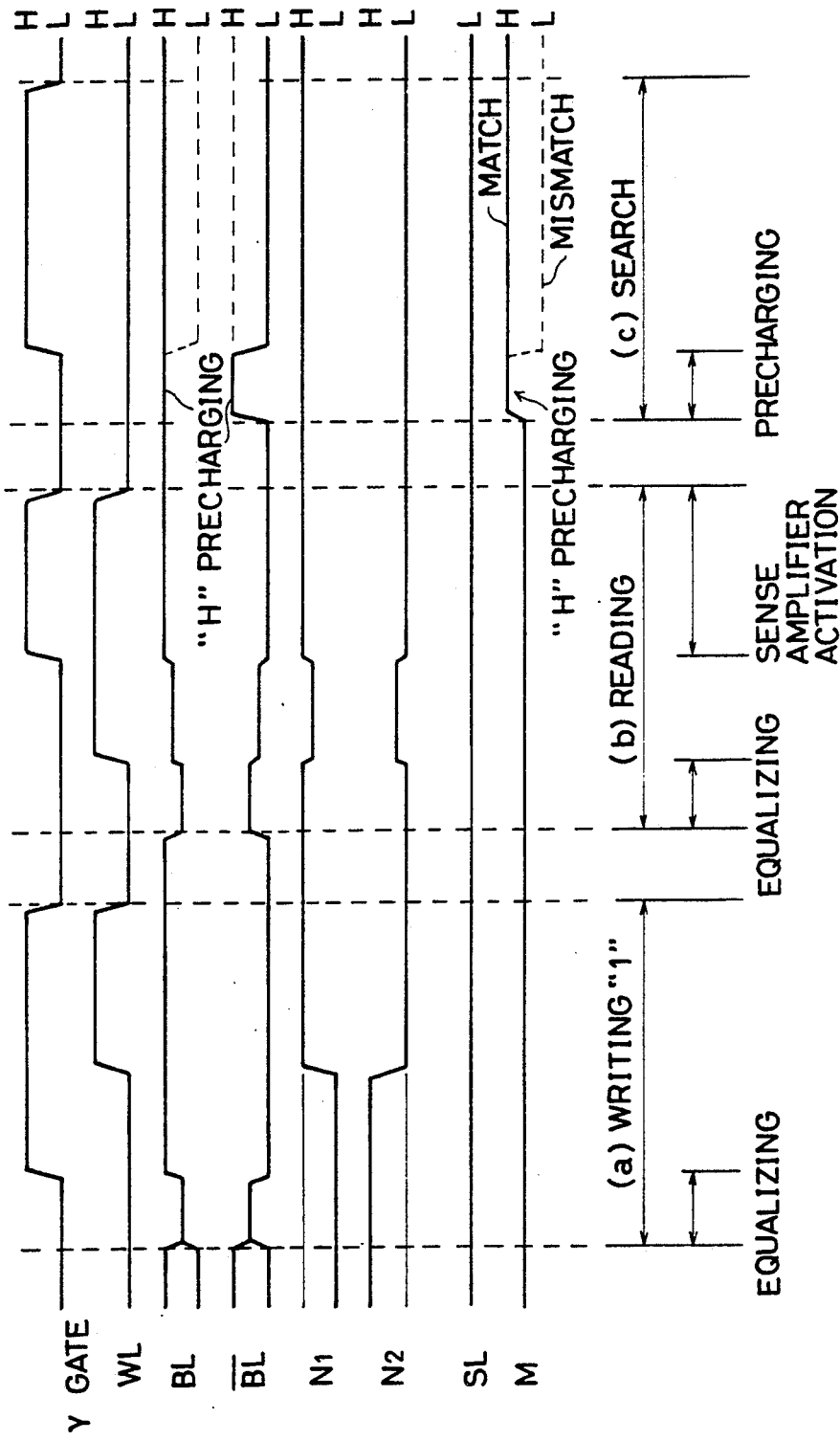
FIG. 9 is a timing chart for explaining a DRAM operation of the nonvolatile CAM shown in FIG. 3.

Referring now to a timing chart of FIG. 9, description is made on the DRAM operation of the nonvolatile CAM shown in FIG. 3.

(a) write mode

First, all the bit line pairs BL and $\overline{BL}$ in the memory cell array 1 are equalized to an equal potential. Thereafter, the transfer gate in the Y gate 8 is selected by the column address decoder 6, to be rendered conductive. Consequently, write data latched in the sense amplifier/data latch 7 is applied onto the selected bit line pair BL and $\overline{BL}$. It is assumed here that the write data is "1". As a result, the potential on the bit line BL attains the "H" level while the potential on the bit line $\overline{BL}$ attains the "L" level. Thereafter, the potential on the word line WL selected by the row address decoder 5 is raised to the "H" level. Consequently, the potential of the storage node N1 in the selected memory cell MC attains the "H" level while the potential of the storage node N2 attains the "L" level. In the above described manner, the data "1" is written to the capacitances C1 and C2 in the selected memory cell MC.

(b) read mode

First, all the bit line pairs BL and $\overline{BL}$ in the memory cell array 1 are equalized to an equal potential. The potential on the word line WL selected by the row address decoder 5 is then raised to the "H" level. Consequently, data stored in the capacitances C1 and C2 in the memory cell MC connected to the word line WL are read out onto the corresponding bit line pair BL and $\overline{BL}$, respectively. It is assumed here that data "1" is stored in the memory cell MC. As a result, the potential on the bit line BL is raised while the potential on the bit line $\overline{BL}$ is lowered. Thereafter, any of the transfer gates in the Y gate 8 is rendered conductive by the column address decoder 6, and the sense amplifier/data latch 7 is rendered active. Consequently, the potential difference between the selected bit line pair BL and $\overline{BL}$ is amplified, to be outputted through the data input/output circuit 3.

(c) search mode

First, all the bit line pairs BL and $\overline{BL}$ and match lines M in the memory cell array 1 are reset to the "H" level and then, search data latched in the sense amplifier/data latch 7 is applied to each of the bit line pairs BL and $\overline{BL}$ through the Y gate 8. As a result, in each row in the memory cell array 1, if data stored in the capacitances C1 and C2 in all the memory cells MC all match with data respectively applied to the corresponding bit line pairs BL and $\overline{BL}$, the potential on the corresponding match line M remains at the "H" level. However, in each row in the memory cell array 1, if any of the data stored in the capacitances C1 and C2 in the memory cells MC does not coincide with the search data applied to the corresponding bit line pairs BL and $\overline{BL}$, the coincidence detecting line M is discharged such that potential thereon becomes the "L" level. Thus, the result of search for each row in the memory cell array 1 is stored in the search result storing register 15 through the M precharging/sensing circuit 14. The search result processing circuit 16 collectively processes the result of search of a plurality of rows in the memory cell array 1, to apply the same to the row address encoder 17. The row address encoder 17 converts the result of search into an address signal, to output the same to the exterior through the address data input/output circuit 2.

Figure 10:
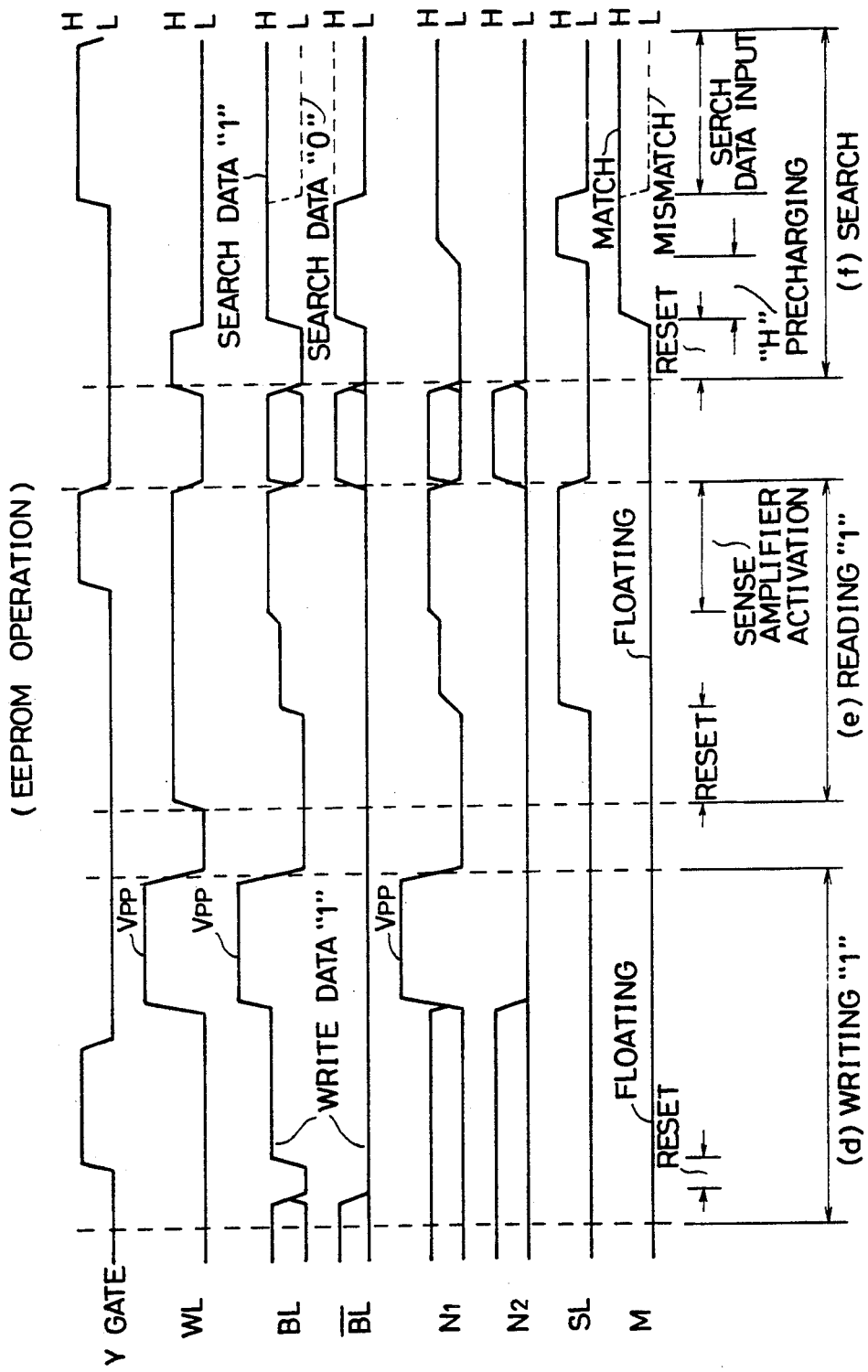
FIG. 10 is a timing chart for explaining an EEPROM operation of the nonvolatile CAM shown in FIG. 3.

Referring now to a timing chart of FIG. 10, description is made on the EEPROM operation of the nonvolatile CAM shown in FIG. 3.

(d) write mode

First, by a resetting operation, all the bit line pairs BL and $\overline{BL}$ in the memory cell array 1 are grounded. A transfer gate in the Y gate 8 is selected by the column address decoder 6, to be rendered conductive. Consequently, write data latched in the sense amplifier/data latch 7 is applied onto the selected bit line pair BL and $\overline{BL}$. It is assumed here that write data is "1". As a result, the potential on the bit line BL attains the "H" level while the potential on the bit line $\overline{BL}$ attains the "L" level. A transfer gate in the Y gate 8 is rendered nonconductive and then, the word line WL in the memory cell array 1 is selected by the row address decoder 5. On this occasion, the high voltage switching circuit 10b receives an output of the high voltage generating circuit 9 and applies a high voltage $V_{PP}$ to the selected word line WL. At the same time, the high voltage switching circuit 10a receives an output of the high voltage generating circuit 9 and applies the high voltage $V_{PP}$ to the bit line BL out of the selected bit line pair BL and $\overline{BL}$, to hold the potential on the bit line $\overline{BL}$ at a ground potential. As a result, the potential of the storage node N1 in the selected memory cell MC is raised to the high voltage $V_{PP}$ while the potential of the storage node N2 remains at the ground potential. In the above described manner, the threshold voltage $V_{TH}$ of the memory transistor M1 is shifted in a negative direction and the threshold voltage $V_{TH}$ of the memory transistor M2 is shifted in a positive direction in the selected memory cell MC, so that data "1" is written to the memory transistors M1 and M2 in the memory cell MC.

(e) read mode

First, a potential on the word line WL selected by the row address decoder 5 is raised to the "H" level. All the bit line pairs BL and $\overline{BL}$ in the memory cell array 1 are grounded by a resetting operation. Thereafter, a potential on the signal line SL corresponding to the selected word line WL is raised to the "H" level by the SL decoder 12. It is assumed here that data "1" is stored in the memory cell MC. Since the memory transistor M1 is conductive and the memory transistor M2 is non-conductive, the potential of the storage node N1 in the memory cell MC is raised and the potential on the bit line BL is raised. On this occasion, the potential of the storage node N2 in the memory cell MC and the potential on the bit line $\overline{BL}$ remain at the ground potential level. Thereafter, the sense amplifier/data latch 7 is activated, so that the potential differences between the bit lines BL and and $\overline{BL}$ between the storage nodes N1 and N2 are further amplified. Furthermore, any one of the transfer gates in the Y gate 8 is rendered conductive by the column address decoder 6, so that data read out onto the selected bit line pair BL and $\overline{BL}$ is outputted through the data input/output circuit 3.

(f) search mode

First, the potential on the word line WL selected by the row address decoder 5 is raised to the "H" level, and the bit line pair BL and $\overline{BL}$ and the storage nodes N1 and N2 in the memory cell array 1 are grounded. The potential on the word line WL is lowered to the "L" level and then, the match line M corresponding to the work line WL is precharged to the "H" level by the M precharging/sensing circuit 14. In addition, the potential on the corresponding signal line SL is raised on the "H" level by the SL decoder 12. When the Y gate 8 is rendered conductive, search data latched in the sense amplifier/data latch 7 is applied onto each of the bit line pairs BL and $\overline{BL}$. As a result, in the selected row in the memory cell array 1, if data stored in all of the memory cells MC match with search data respectively applied to the corresponding bit line pairs BL and $\overline{BL}$, the potential on the match line M remains at the "H" level. However, in the selected row in the memory cells MC does not match with the search data applied to the corresponding bit line pair BL and $\overline{BL}$, the match line M is discharged such that a potential thereon becomes the "L" level. In the above described manner, the result of search for each row in the memory cell array 1 is stored in the search result storing register 15.

Meanwhile, match is generally retrieved by simultaneously processing a plurality of bits. However, it is rate to designate all the bits. More specifically, a mask function of rendering invalid searching for a part of the bits is required. In the above described embodiment, this mask function is achieved by precharging a bit line pair BL and $\overline{BL}$ to be masked at the "H" level. In the memory cell MC shown in FIG. 5, even if the potential of the "H" level is applied to the gate of the transistor T14 or T15, the potentials on the bit lines BL and $\overline{BL}$ are at the "H" level, so that the potential on he match line M remains at the "H" level. Thus, match can be searched in bits other than a masked bit.

Therefore, in the nonvolatile CAM according to the above described embodiment, high-speed reading and writing are possible by the DRAM operation, and nonvolatile manner in the memory transistors M1 and M2 in each of the memory cells MS when a power supply is turned off while being read out from the memory transistors M1 and M2 in each of the memory cells MC by the EEPROM operation when the power supply is turned on. When the power supply is turned on, high-speed writing and reading to and from the capacitances C1 and C2 in each of the memory cells MC and searching therebetween can be performed by the DRAM operation. In addition, writing and reading to and from the memory transistors M1 and M2 in each of the memory cells MC and searching therebetween can be performed by the EEPROM operation. When data have been stored in the memory transistors M1 and M2 in each of the memory cells MC by the EEPROM operation before the power supply is turned off, the data are not lost after the power supply is turned off.

Figure 12:
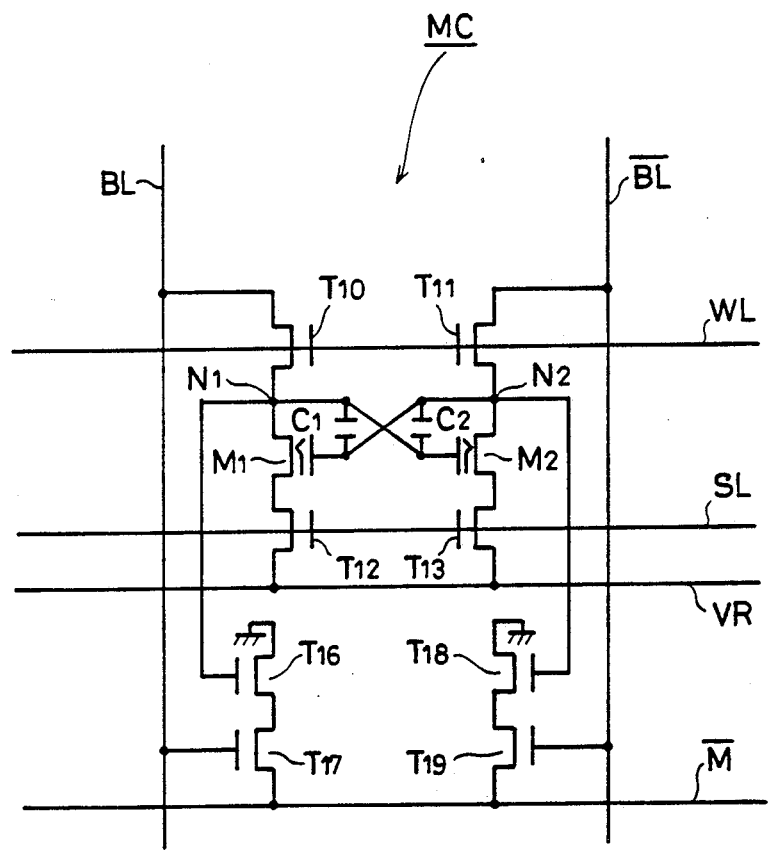
FIG. 12 is a circuit diagram of a memory cell in a nonvolatile CAM according to another embodiment of the present invention.

FIG. 12 is a circuit diagram showing a memory cell in a nonvolatile CAM according to another embodiment of the present invention.

In the memory cell MC shown in FIG. 12, the transistors T14 and T15 in the memory cell MC shown in FIG. 5 and the match line M are replaced with transistors T16 to T19 and an mismatch line $\overline{M}$. The transistors T16 and T17 are connected in series between the mismatch line $\overline{M}$ and the ground potential. In addition, similarly, the transistors T18 and T19 are connected in series between the mismatch line $\overline{M}$ and the ground potential. The transistor T16 has its gate connected to a storage node N1, and the transistor T17 has its gate connected to a bit line BL. The transistor T18 has its gate connected to a storage node N2, and the transistor T19 has its gate connected to a bit line $\overline{BL}$.

At the time of searching, the mismatch line $\overline{M}$ is precharged to the "H" level. It is assumed that data "1" is stored in the memory cell MC. When search data is "1", a potential on the bit line BL is brought to the "H" level while a potential on the bit line $\overline{BL}$ is brought to an "L" level. Thus, the transistors T16 and T17 are turned on, so that the mismatch line $\overline{M}$ is discharged such that a potential thereon becomes the "L" level (detection of match). Contrary to this, when the search data is "0", the potential on the bit line BL is brought to the "L" level while the potential on the bit line $\overline{BL}$ is brought to the "H" level. Consequently, the transistors T17 and T18 are turned off. Thus, the potential on the mismatch line $\overline{M}$ remains at the "H" level (detection of mismatch).

Meanwhile, when the bit line pair BL and $\overline{BL}$ is masked in the memory cell MC shown in FIG. 12, it is necessary to bring the potential on the bit line pair BL and $\overline{BL}$ to the "L" level.

Although in the memory cell MC shown in FIGS. 5 and 12, a stray capacitance is used as a DRAM memory capacitor, a DRAM capacitance may be formed between a drain and a control gate of at least one of the memory transistors M1 and M2.

Figure 13:
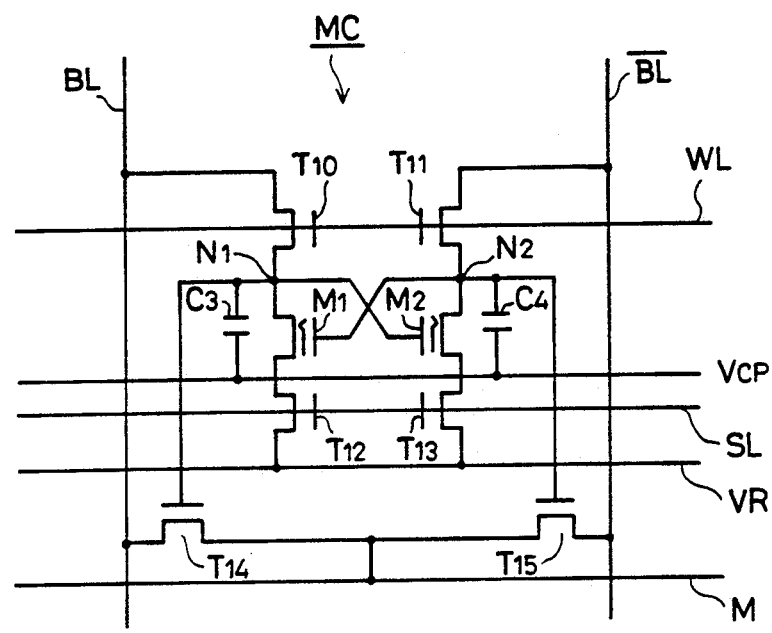
FIG. 13 is a circuit diagram of a memory cell in a nonvolatile CAM according to still another embodiment of the present invention.
Figure 14:
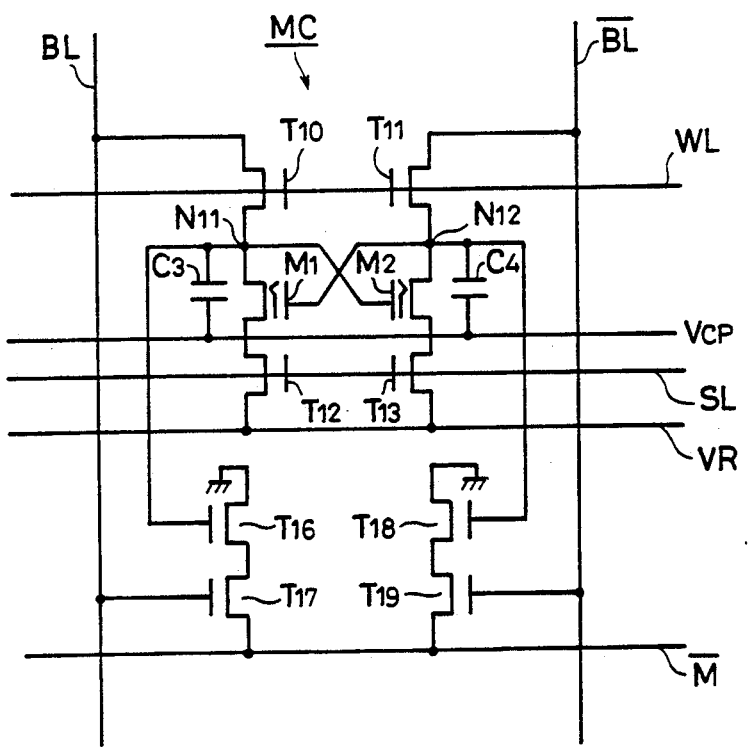
FIG. 14 is a circuit diagram of a memory cell in a nonvolatile CAM according to a further embodiment of the present invention.

Additionally, as shown in FIG. 13 and 14, a capacitance C3 may be formed between a storage node N1 and a potential line $V_{CP}$, and a capacitance C4 may be formed between a storage node N2 and the potential line $V_{Cp}$. A predetermined potential is applied to the potential line $V_{Cp}$. With respect to structures of other portions, a memory cell MC shown in FIG. 13 is the same as the memory cell MC shown in FIG. 5, and a memory cell MC showing in FIG. 14 is the same as a memory cell MC shown in FIG. 12.

Although in the above described embodiments, an FLOTOX (Floating Gate Tunneling Oxide Type) type memory transistor is used as the memory transistors M1 and M2, a transistor may be used in which the threshold voltage $V_{TH}$ is made variable, such as an MNOS (Metal Nitride Oxide Semiconductor) type memory transistor.

Additionally, timings and conditions for applying voltages are not limited to those in the above described embodiments. For example, at the time of searching, the match line M may be precharged at the "H" level with the potential on the bit line pair BL and $\overline{BL}$ being at the "H" level. In addition, in the ordinary DRAM operation and EEPROM operation, a potential on the match line M may be brought to the "H" level and a high voltage $V_{PP}$ level, respectively.

As described in the foregoing, according to the present invention, since each memory cell comprises capacitance means and nonvolatile memory means, a nonvolatile CAM can be obtained in which high-speed reading, writing, nonvolatile storing and detection of match are possible. In addition, the reading operation is speeded up by a combination of two nonvolatile memory means.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile CAM capable of both dynamic and nonvolatile memory operation comprising:
   at least one word line,
   at least one bit line pair comprising a first bit line and a second bit line and provided intersecting with said word line,
   a match line provided corresponding to said word line, and
   a memory cell provided at an intersection of said word line and said bit line pair having first and second storage nodes to store complementary information, respectively,
   said memory cell comprising
   capacitance means coupled to said first and second storage nodes for dynamic memory storage,
   first, information-writable and erasable nonvolatile memory means coupled to said first storage node,
   second, information-writable and erasable nonvolatile memory means coupled to said second storage node,
   first switching means responsive to a potential applied to said word line for electrically connecting or disconnecting said first bit line with said first storage node,
   second switching means responsive to a potential applied to said word line for electrically connecting or disconnecting said second bit line with said second storage node, and
   matching sense means for outputting a match signal to said match line when information applied to said first and second bit lines and information stored in said first and second storage nodes match each other.

2. The nonvolatile CAM according to claim 1, wherein said first nonvolatile memory means comprises a first terminal coupled to said first storage node, a second terminal biased a predetermined potential at the time of reading, and a third terminal coupled to said second storage node, and said second nonvolatile memory means comprises a first terminal coupled to said second storage node, a second terminal biased a predetermined potential at the time of reading, a third terminal coupled to said first storage node.

3. The nonvolatile CAM according to claim 2, which further comprises third switching means coupled between said second terminal in said first nonvolatile memory means and said predetermined potential and responsive to a predetermined read signal, and fourth switching means coupled between said second terminal in said second nonvolatile memory means and said predetermined potential and responsive to said predetermined read signal.

4. The nonvolatile CAM according to claim 2, wherein said first and second nonvolatile memory means comprise erasable and programmable read only memory.

5. The nonvolatile CAM according to claim 2, wherein said capacitance means comprises a first stray capacitance between said first terminal and said third terminal in said first nonvolatile memory means, and a second stray capacitance between said first terminal and said third terminal in said second nonvolatile memory means.

6. The nonvolatile CAM according to claim 1, wherein said capacitance means comprises a capacitor formed between said first storage node and said second storage node.

7. The nonvolatile CAM according to claim 1, wherein said capacitance means comprises a first capacitor coupled between said first storage node and a predetermined potential, and a second capacitor coupled between said second storage node and the predetermined potential.

8. The nonvolatile CAM according to claim 1, wherein said capacitance means comprises a stray capacitance.

9. The nonvolatile CAM according to claim 1, wherein said first switching means comprises a first MOS transistor connected between said first bit line and said first storage node and having a gate connected to said word line, and said second switching means comprises a second MOS transistor connected between said second bit line and said second storage node and having a gate connected to said word line.

10. The nonvolatile CAM according to claim 9, wherein said matching sense means comprises a third switching means coupled between a predetermined potential and said match line and having another terminal connected to said first storage node, and fourth switching means coupled between a predetermined potential and said match line having another terminal connected to said second storage node.

11. The nonvolatile CAM according to claim 10, wherein said third switching means comprises third and fourth MOS transistors connected in series between said predetermined potential and said match line, said third MOS transistor having a gate connected to said first storage node and said fourth MOS transistor having a gate connected to said first bit line, and said fourth switching means comprises fifth and sixth MOS transistors coupled in series between said predetermined potential and said match line, said fifth MOS transistor having a gate connected to said second storage node and said sixth MOS transistor having a gate connected to said second bit line.

12. The nonvolatile CAM according to claim 1, wherein said matching sense means comprises third switching means coupled between said first bit line and said matchline and having another terminal connected to said first storage node, and fourth switching means coupled between said second bit line and said match line and having another terminal connected to said second storage node.

13. The nonvolatile CAM according to claim 12, wherein said third switching means comprises a MOS transistor coupled between said first bit line and said match line and having a gate coupled to said first storage node, and said fourth switching means comprises a MOS transistor coupled between said second bit line and said match line and having a gate coupled to said second storage node.

14. A nonvolatile CAM comprising:

a plurality of word lines, a plurality of bit line pairs each comprising a first bit line and a second bit line and provided intersecting with said plurality of word lines, a plurality of match lines provided corresponding to said plurality of word lines, a plurality of memory cells each provided at an intersection of said plurality of word lines and said plurality of bit line pairs and having first and second storage nodes storing complementary information, each of said plurality of memory cells comprising capacitance means coupled between said first storage node and said second storage node, first, information-writable and erasable nonvolatile memory means coupled to said first storage node, second, information-writable and erasable nonvolatile memory means coupled to said second storage node, first switching means responsive to a selecting signal applied to the corresponding word line for electrically connecting said first bit line with said first storage node, second switching means responsive to a selecting signal applied to the corresponding word line for electrically connecting said second bit line with said second storage node, and matching sense means for outputting a match signal to the corresponding match line when information applied to said first and second bit lines and information stored in said first and second storage nodes match with each other, said nonvolatile CAM further comprising first selecting means for selecting one of said plurality of word lines second selecting means for selecting one of said plurality of bit line pairs, writing means for writing information to said capacitance means in the memory cell provided at an intersection of the word line selected by said first selecting means and the bit line pair selected by said second selecting means, reading means for reading out information from said capacitance means in the memory cell provided at an intersection of the word line selected by said first selecting means and the bit line pair selected by said second selecting means, said writing means further comprising means for writing information to said first and second nonvolatile memory means in the memory cell provided at an intersection of the word line selected by said first selecting means and the bit line pair selected by said second selecting means, said reading means further comprising means for reading out information from said first and second nonvolatile memory means in the memory cell provided at an intersection of the word line selected by said first selecting means and the bit line pair selected by said second selecting means, searching means for applying search data to one or any of said plurality of bit line pairs and searching between the search data and data stored in said capacitance means in the memory cell connected to the bit line pair, and said searching means further comprising means for applying search data to one or any of said plurality of bit line pairs and searching between the search data and data stored in said first and second nonvolatile memory means in the memory cell connected to the bit line pair.

15. A method for operating a nonvolatile CAM comprising a plurality of word lines, a plurality of bit line pairs each comprising a first bit line and a second bit line and provided intersecting with said plurality of word lines, a plurality of match line provided corresponding to said plurality of word lines, and a plurality of memory cells each provided at any of intersections of said plurality of word lines and said plurality of bit line pairs and receiving complementary information, each of said plurality of memory cells comprising first nonvolatile memory means coupled between said first storage node and said second storage node, second nonvolatile memory means coupled to said second storage node, first switching means responsive to a selecting signal applied to the corresponding word line for electrically connecting said first bit line with said first storage node, second switching means responsive to a selecting signal applied to the corresponding word line for electrically connecting said second bit line with said second storage node, and matching sense means for outputting a match signal to said match line when information applied to said first and second bit lines and information stored in said first and second storage nodes coincide with each other, comprising a dynamic writing operation, a dynamic reading operation, a dynamic searching operation, a nonvolatile writing operation, a nonvolatile reading operation and a nonvolatile searching operation, said dynamic writing operation comprising the steps of selecting any of said plurality of memory cells by selecting one or any of said plurality of word lines and one or any of said plurality of bit line pairs, and writing information to said capacitance means in the selected memory cell through the selected bit line pair, said dynamic reading operation comprising the steps of selecting one or any of said plurality of memory cells by selecting one or any of said plurality of word lines and one or any of said plurality of bit line pairs, and reading out information stored in said capacitance means in the selected memory cell through the selected bit line pair, said dynamic searching operation comprising the steps of applying search data to one or any of said plurality of bit line pairs, activating said matching sense means in each of said plurality of memory cells, and detecting an output of the corresponding match line, said nonvolatile writing operation comprises the steps of selecting any of said plurality of memory cells by selecting one or any of said plurality of word lines and one or any of said plurality of bit line pairs, and writing information to said first and second nonvolatile memory means in the selected memory cell through the selected bit line pair, said nonvolatile reading operation comprises the steps of selecting one or any of said plurality of memory cells by selecting any of said plurality of word lines and one or any of said plurality of bit line pairs, and reading out information stored in said first and second nonvolatile memory means in the selected memory cell through the selected bit line pair, said nonvolatile searching operation comprises applying search information to one or any of said plurality of bit line pairs, reading out information stored in said first and second nonvolatile memory means in each of said plurality of memory cells to said first and second storage nodes, activating said matching sense means, and detecting an output of the corresponding match line.

* * * * *